(12) United States Patent
Yuan et al.

(10) Patent No.: US 8,426,292 B2
(45) Date of Patent: Apr. 23, 2013

(54) PROCESS FOR SAPPHIRE SUBSTRATE SEPARATION BY LASER

(75) Inventors: Shu Yuan, Singapore (SG); Xuejun Kang, Singapore (SG)

(73) Assignee: Tinggi Technologies Private Limited, Singapore (SG)

( * ) Notice: Subject to any disclaimer, the term of this patent is extended or adjusted under 35 U.S.C. 154(b) by 304 days.

(21) Appl. No.: 12/746,760

(22) PCT Filed: Dec. 1, 2008

(86) PCT No.: PCT/SG2008/000459
§ 371 (c)(1),
(2), (4) Date: Jun. 7, 2010

(87) PCT Pub. No.: WO2009/075651
PCT Pub. Date: Jun. 18, 2009

(65) Prior Publication Data
US 2010/0255656 A1    Oct. 7, 2010

(30) Foreign Application Priority Data

Dec. 10, 2007    (SG) ............................... 200718568-9

(51) Int. Cl.
*H01L 21/30* (2006.01)
(52) U.S. Cl.
USPC ............... 438/458; 438/51; 438/404; 438/22; 257/94; 257/506; 257/531; 257/E33.059
(58) Field of Classification Search ............... 438/22–26, 438/51, 404, 458; 257/94, 506, 531, E33.059, 257/E21.002, E21.398
See application file for complete search history.

(56) References Cited

U.S. PATENT DOCUMENTS

| | | |
|---|---|---|
| 2005/0227455 A1 | 10/2005 | Park et al. |
| 2007/0134826 A1 | 6/2007 | Baik et al. |
| 2008/0149953 A1 | 6/2008 | Ando et al. |

FOREIGN PATENT DOCUMENTS

EP    1662587 A2    5/2006

OTHER PUBLICATIONS

PCT International Search Report and Written Opinion, PCT/SG2008/000459, Jan. 29, 2009, 8 pages.

*Primary Examiner* — Evan Pert
*Assistant Examiner* — Mark A Laurenzi
(74) *Attorney, Agent, or Firm* — Fenwick & West LLP

(57) ABSTRACT

A method of fabricating semiconductor devices is disclosed. The method comprises providing a wafer comprising a substrate with a plurality of epitaxial layers mounted on the substrate. Patterns are formed above the plurality of epitaxial layers remote from the substrate. A second substrate of a conductive metal is formed on the plurality of epitaxial layers remote from the substrate and between the patterns. The second substrate, the plurality of epitaxial layers and the substrate are at least partially encapsulated with a soft buffer material. The substrate is separated from the plurality of epitaxial layers at the wafer level and while the plurality of epitaxial layers are intact while preserving electrical and mechanical properties of the plurality of epitaxial layers by applying a laser beam through the substrate to an interface of the substrate and the plurality of epitaxial layers, the laser beam having well defined edges.

17 Claims, 13 Drawing Sheets

PROCESS FOR SAPPHIRE SUBSTRATE SEPARATION BY LASER

TECHNICAL FIELD

This invention relates to the fabrication of semiconductor devices and refers particularly, though not exclusively, to the removal of a sapphire substrate of such devices.

BACKGROUND

GaN semiconductor devices such as, for example, light emitting diodes ("LEDs"), laser diodes, photodetectors, transistors, switches, and so forth, are widely used in many applications. Well known applications include, but are not limited to, traffic signals, mobile telephone display backlighting, liquid crystal display ("LCD") back lighting, flash lights for cameras, and so forth. The fabrication of gallium nitride semiconductors for use as LEDs, laser diodes or lighting, gives relatively low productivity.

There have been many proposals for the removal of a sapphire substrate from semiconductor light emitting devices by use of a laser. However, in all instances either the semiconductor layers (normally including epitaxial layers) crack thus significantly reducing yield; or the semiconductor layers are separated into individual devices prior to removal of the substrate. It has not been possible to remove the substrate by laser lift-off for the entire wafer without cracking, or separation before removal.

SUMMARY

According to an exemplary aspect there is provided a method of fabricating semiconductor devices. The method comprises providing a wafer comprising a substrate with a plurality of epitaxial layers mounted on the substrate. Patterns are formed above the plurality of epitaxial layers remote from the substrate. A second substrate of a conductive metal is formed on the plurality of epitaxial layers remote from the substrate and between the patterns. The second substrate, the plurality of epitaxial layers and the substrate are at least partially encapsulated with a soft buffer material. The substrate is separated from the plurality of epitaxial layers at the wafer level and while the plurality of epitaxial layers are intact while preserving electrical and mechanical properties of the plurality of epitaxial layers by applying a laser beam through the substrate to an interface of the substrate and the plurality of epitaxial layers, the laser beam having well defined edges.

The well defined edges may be sharp edges. The sharp edges may be formed by the use of at least one of: razor edges, cropping by a mask, an aperture, a set of optics, and one or more imaging lenses.

The soft buffer layer may be selected from: an emulsion, a rubber emulsion, silicone, epoxy, glue, a thermal glue, Crystal Bond, and wax. The soft buffer material may fully encapsulate the second substrate, the plurality of epitaxial layers, and the substrate.

The method may further comprise: prior to forming the patterns, forming a thin layer of at least one p-type metal Ohmic contact layer on the plurality of epitaxial layers, and forming at least one seed layer on the at least one p-type metal Ohmic contact layer. The second substrate may be relatively thick and may be for at least one of: a structural support, a heat sink, a heat dissipater, a current dissipater, and as a terminal, for the semiconductor devices.

The patterns may be a photoresist formed by photolithography. The photoresist may be of a height of at least 10 micrometers. The height may be at least 100 micrometers. The photoresist may be of a material that can form high aspect ratio patterns. The photoresist may be SU-8. The photoresist may be of a material that at least minimizes by absorbsion any shock during the laser lift off process caused by the laser interaction with the semiconductor the shock including at least one of: wave shock, shock waves and shock fronts. Before the application of the photoresist, the at least one seed layer may be partially etched in the center of each street between mesas, the photoresist patterns being formed in the etched portion in the centre of each street.

BRIEF DESCRIPTION OF DRAWINGS

In order that the present invention may be fully understood and readily put into practical effect, there shall now be described by way of non-limitative example only exemplary embodiments of the present invention, the description being with reference to the accompanying illustrative drawings.

In the drawings.

DETAILED DESCRIPTION OF THE EXEMPLARY EMBODIMENTS

Figure 1:
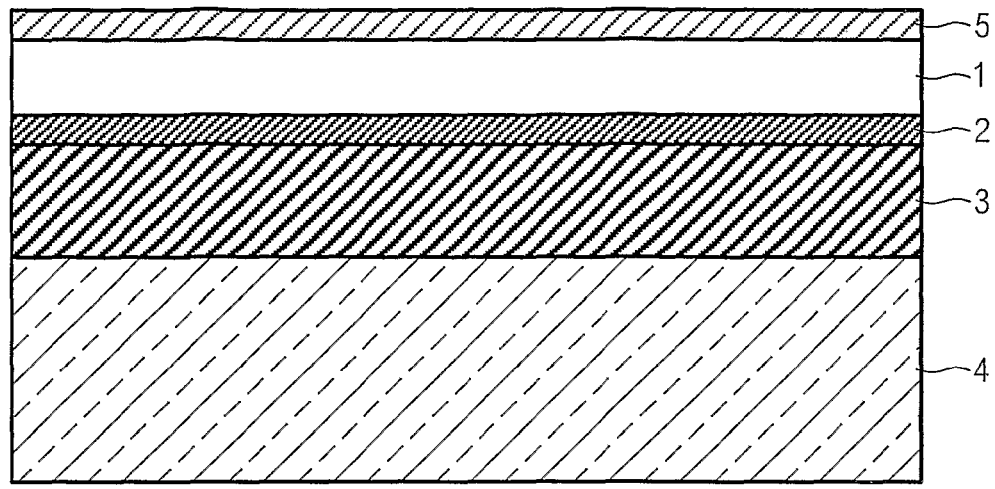
FIG. 1 is a non-scale schematic, cross-sectional view of a semiconductor at a first stage in the fabrication process.

The GaN devices described below are fabricated from epitaxial wafers that consist of a stack of thin semiconductor layers (called epitaxial layers) on a sapphire substrate. The composition and thickness of the epitaxial layers depends on the wafer design, and determine the light colour (wavelength) of light that will be emitted by the devices that are fabricated from the wafer. Usually a thin buffer layer is first deposited on the sapphire substrate with a thickness often in the range 10 to 30 nm, and can be either AlN or GaN. In this specification this layer is not described or illustrated. On top of the thin buffer layer may be another buffer layer such as, for example, a relatively thick buffer layer and that is usually doped or unintentionally doped. It may have a thickness in the range 1 to 7 micrometers. The relatively thick buffer layer is followed by other layers made of GaN, AlGaN, InN, InGaN, AlGaInN, and so forth. To achieve high wafer quality, n-type layers are often deposited on the buffer layers, followed by an active region. Finally, p-type doped layers are deposited. The active region is usually a double heterostructure made of a single quantum well, or multiple quantum wells and is for light generation. But it may be in other forms such as, for example, quantum dots. The deposition of epitaxial layers is usually by metal organic chemical vapor deposition ("MOCVD") or molecular bean epitaxy ("MBE"). The thickness of the epitaxial layers is in the range from a few nanometers to a few microns.

The process starts after the sapphire substrate 4 has applied to it the n-type layer 3 of gallium nitride (GaN), the quantum well or active layer 2, and the p-type layer 1 of GaN. For simplicity, the n-type layer 3 includes all layers below the active layer 2, including the two buffer layers, and the other layers referred to above. The p-type layer 1 is relatively thin— normally no more, but preferably less, than 1 micron. A p-metal layer 5 is then applied over the p-type layer 1. The p-type metal layer 5 may be of nickel-gold (NiAu) or other suitable metal and is preferably relatively thin so that it is transparent. Alternatively, it may be reflective. More preferably it acts as a diffusion barrier to prevent or minimize diffusion into the epitaxial layers 1, 2 and 3.

Figure 2:
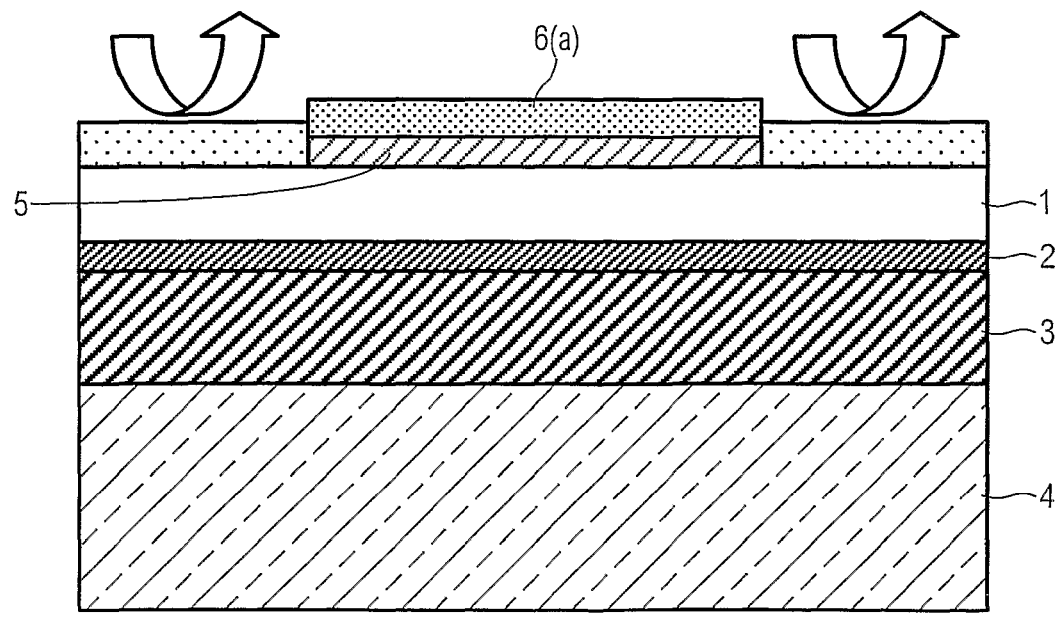
FIG. 2 is a non-scale schematic, cross-sectional view of a semiconductor at a second stage in the fabrication process.

Standard photolithography and etching are then used to pattern layer 5. This is done by applying a thin layer of photoresist (layer 6(a) in FIG. 2) on to metal layer 5, followed by resist exposure and development. The resist pattern 6(a) serves as an etching mask for etching the metal layer 5. The etching may be by wet chemical etching or plasma dry etching (see FIG. 2). The photoresist 6(a) is then removed. The patterned layer 5 that remains on the surface of p-type GaN layer 1 will serve as an Ohmic contact layer to the p-type GaN layer 1. Annealing may take place either before or after layer 5 is patterned.

Figure 3:
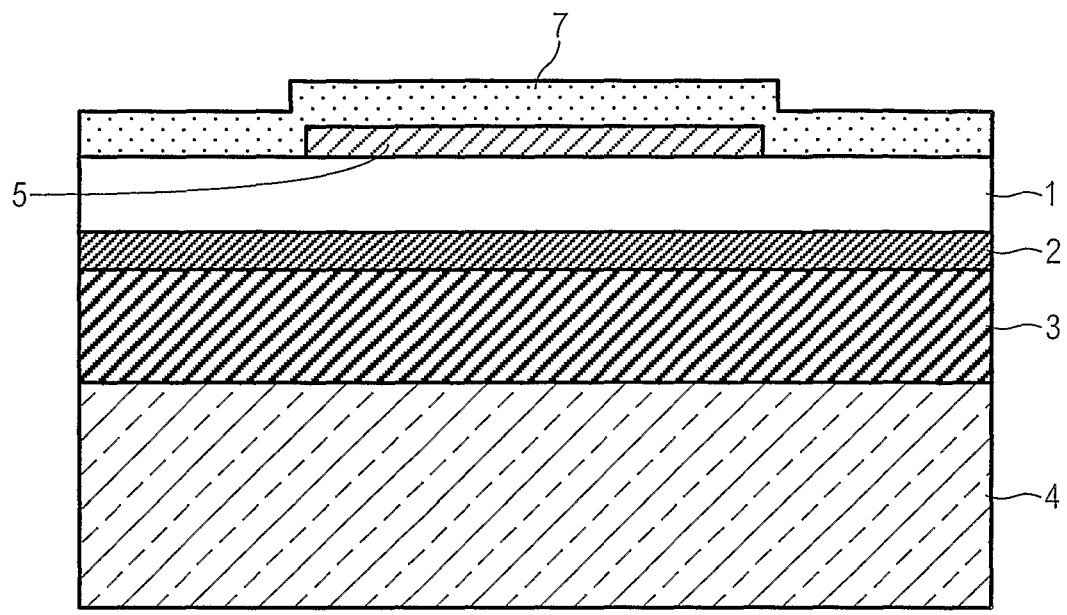
FIG. 3 is a non-scale schematic, cross-sectional view of a semiconductor at a third stage in the fabrication process.

A layer 7 of silicon dioxide ($SiO_2$) is deposited over the remaining p-metal layer portions 5 and the p-type GaN layer 1 (FIG. 3) by a standard thin film deposition method. This may be by plasma enhanced chemical vapor deposition ("PECVD"), sputtering, evaporation, or other suitable techniques.

Figure 4:
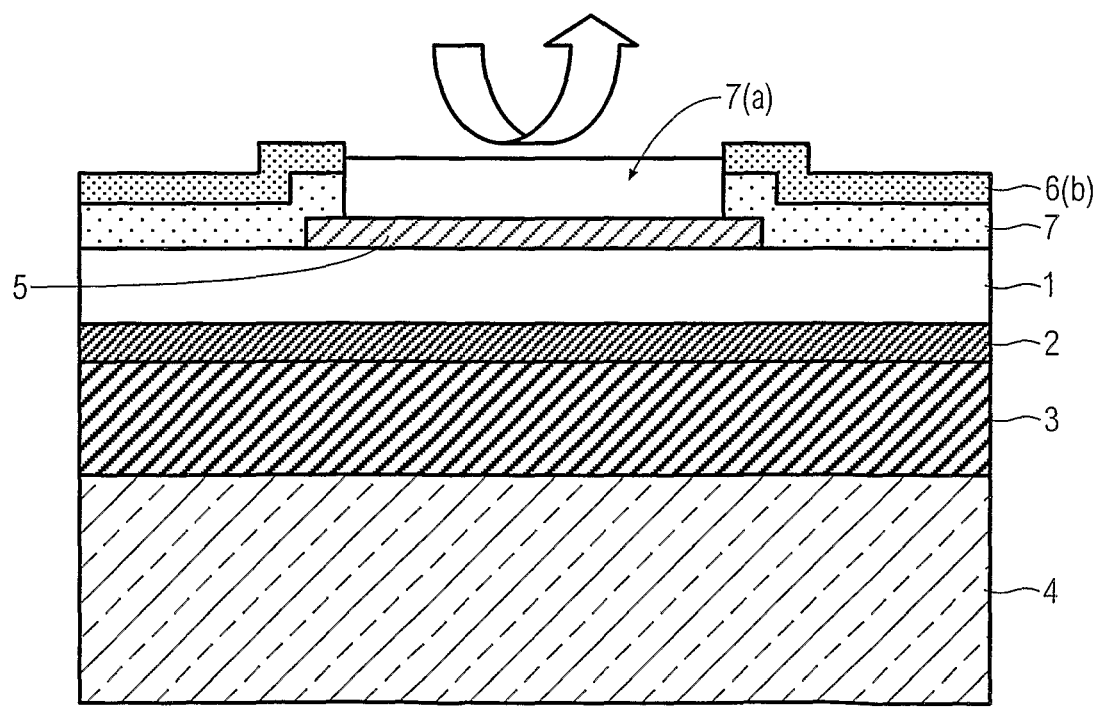
FIG. 4 is a non-scale schematic, cross-sectional view of a semiconductor at a fourth stage in the fabrication process.

As shown in FIG. 4, a second photoresist layer 6(b) is applied over the oxide layer 7. The resist is then patterned and serves as mask for patterning the oxide layer 7. Wet etching or dry etching (plasma etching) of the oxide layer 7 is carried out. The oxide 7 in the areas 7(a) where there is no photoresist 6(b) is removed, while oxide 7 protected by the resist 6(b) remains after etching. The patterned second resist layer 6(b) is larger in area than the NiAu layer 5 so that the $SiO_2$ layer 7 remaining extends across the NiAu layer 5 and down the sides of NiAu layer 5 to the p-type GaN layer 1, as shown in FIG. 4.

Figure 5:
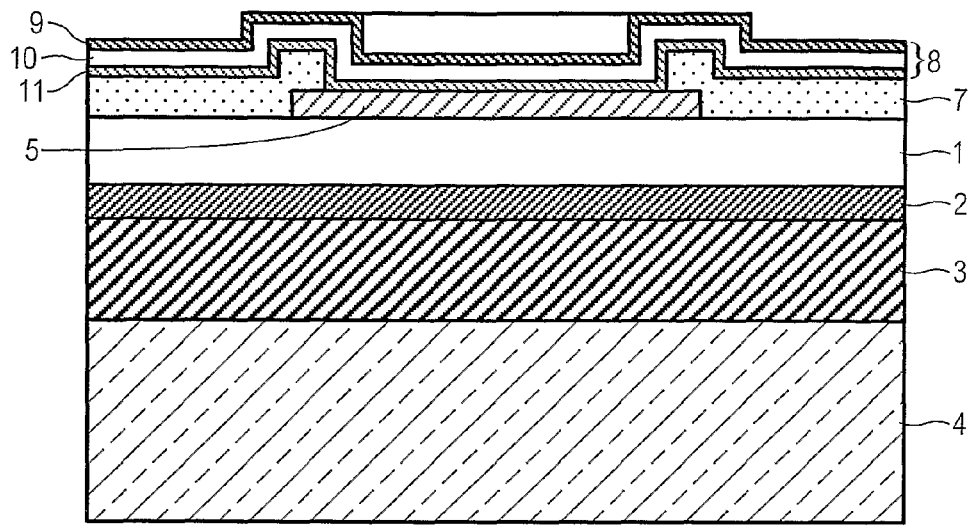
FIG. 5 is a non-scale schematic, cross-sectional view of a semiconductor at a fifth stage in the fabrication process.

As shown in FIG. 5, the second resist layer 6(b) is removed. Seed layer deposition follows, as is shown in FIG. 5. The seed layer 8 is of different metal layers, preferably three different metal layers, as shown. The first seed layer 11 contacts with and adheres well to the NiAu layer 5 and the $SiO_2$ layer 7. It may be of chromium or titanium. It is followed by second layer 10 and third layer 9 of tantalum and copper respectively. Other materials may be used. The first seed layer 11 preferably has good reflectivity for the reflection of light generated in the light emitting device. The second seed layer 10 acts as a diffusion barrier, preventing copper or other materials placed on top of it (such as, for example, the third seed layer 9) from diffusing into the Ohmic contact layer 5 and the semiconductor epitaxial layers 1, 2, 3. The third seed layer 9 acts as a seeding layer for subsequent layer formation.

The coefficients of thermal expansion of the seed layers 9, 10, 11 may be different from that of GaN which is 3.17. While the thermal expansion coefficients of the Ohmic contact layers (Ni and Au) are also different from that of GaN (they are 14.2 and 13.4 respectively), they are relatively thin (a few nanometers) and do not pose serious stress problems to the underlining GaN epitaxial layers. However, a copper layer to be added later may be as thick as hundreds of microns and thus may cause severe stress problems. Thus, the seed layers 9, 10, 11 can be used to buffer the stress. This may be by one or more of:

(a) by having sufficient flexibility to absorb the stress,
(b) by having sufficient internal slip characteristics to absorb the stress,
(c) by having sufficient rigidity to withstand the stress, and
(d) by having graded thermal expansion coefficients.

In the case of graded thermal coefficients, that of the first layer 11 is preferably less than that of the second layer 10, and that of the second layer 10 is preferably less than that of the third layer 9. For example, the first layer 11 may be chromium with a coefficient of thermal expansion of 4.9, the second layer 10 may be tantalum with a coefficient of thermal expansion of 6.3, and the third layer 9 may be copper with a coefficient of thermal expansion of 16.5. In this way the coefficients of thermal expansion are graded from the Ohmic contact 5 and $SiO_2$ layer 7 to the third copper layer 9. An alternative is to have coefficients of expansion that differ such that at the temperatures concerned, one metal layer expands while another contracts.

If the outer, copper layer 9 was applied directly to the $SiO_2$ layer 7 and Ohmic contact 7, the differences in their thermal expansion rates may cause cracking, separation, and/or failure. By depositing a plurality of seed layers 9, 10 and 11 of different materials, particularly metals each having a different coefficient of thermal expansion, the stresses of thermal expansion are spread through the layers 9, 10 and 11 with the resultant lower likelihood of cracking, separation and/or failure. The first seed layer 11 should be of a material with a relatively low coefficient of thermal expansion, whereas the final layer 9 may have a higher coefficient of thermal expansion. If there are intermediate layer(s) 10, the intermediate layer(s) should have coefficient(s) of expansion between those of layers 11 and 9, and should be graded from that of the first layer 11 to that of the final layer 9. There may be no intermediate layer 10, or there may be any required or desired number of intermediate layers 10 (one, two, three and so forth).

Alternatively, the seed layers 9, 10 and 11 may be replaced by a single layer of dielectric such as, for example, AlN with vias or holes therethrough to enable the copper layer 9 to connect to the p-type metal layer 5.

Figure 6:
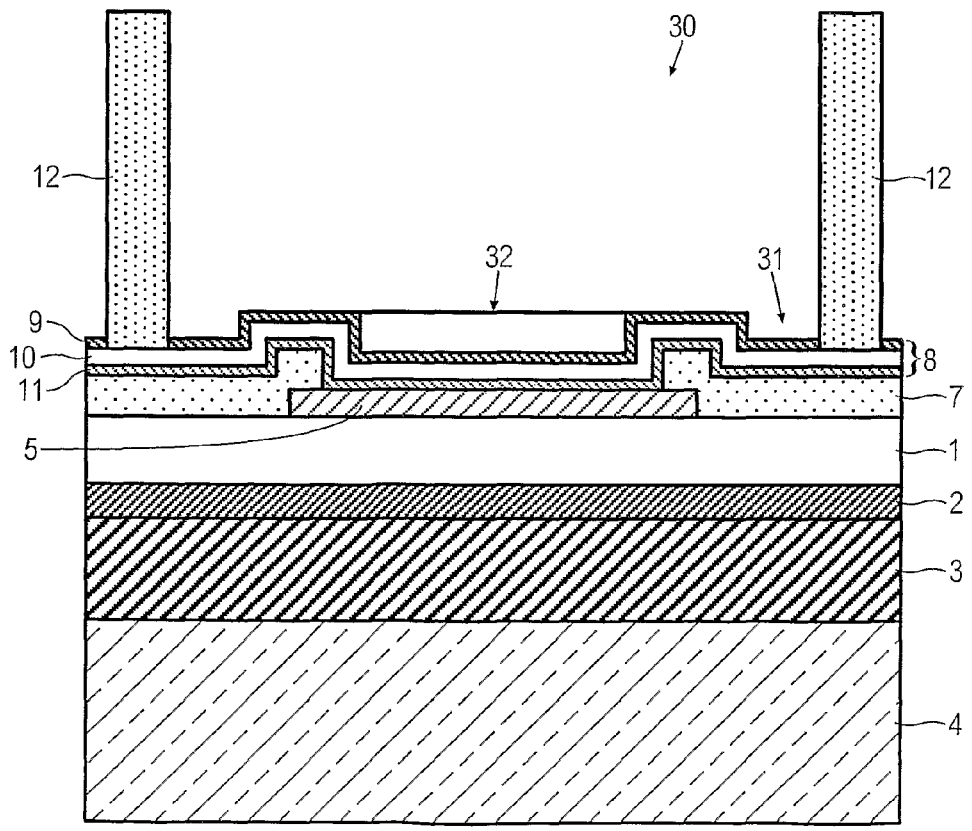
FIG. 6 is a non-scale schematic, cross-sectional view of a semiconductor at a sixth stage in the fabrication process.
Figure 7:
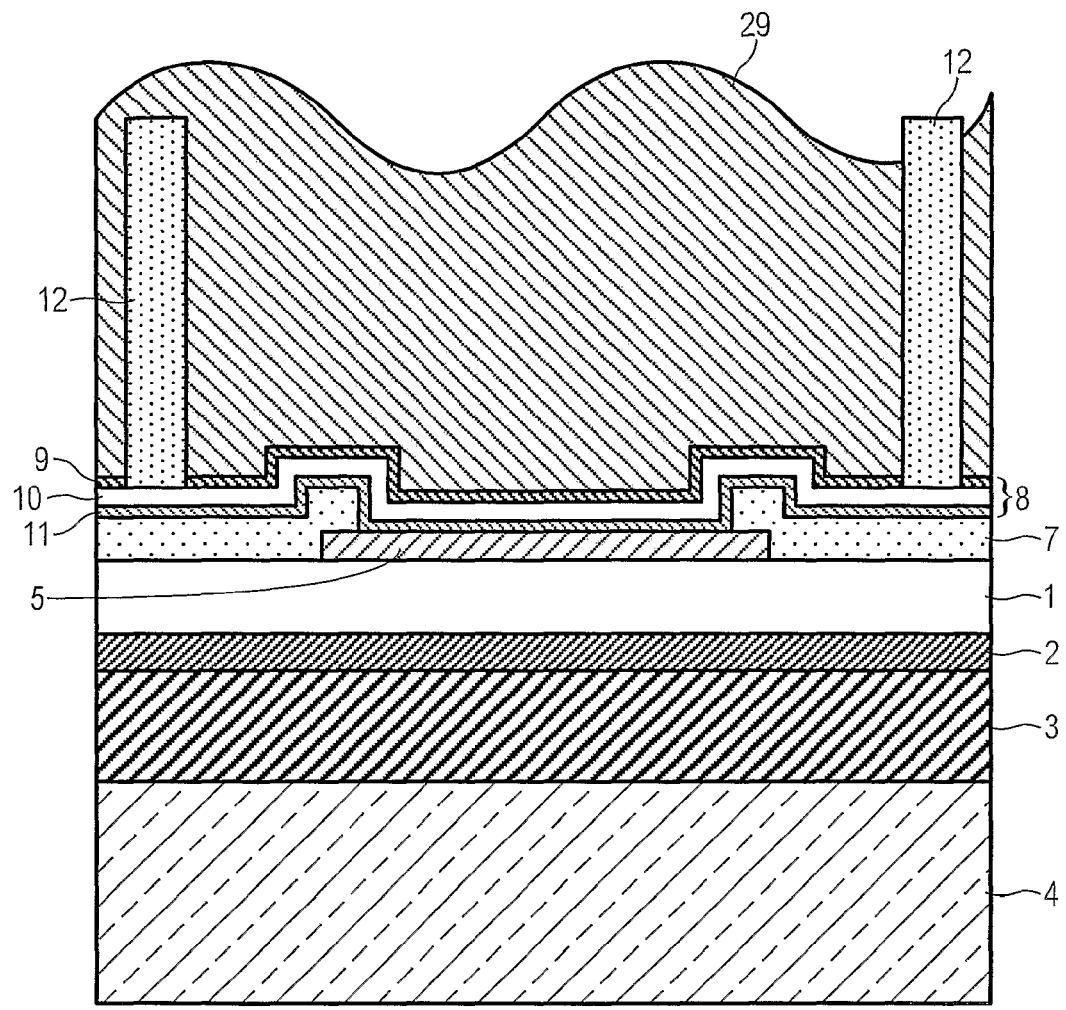
FIG. 7 is a non-scale schematic, cross-sectional view of a semiconductor at a seventh stage in the fabrication process.

For patterned plating of a relatively thick metal such as copper that will serve as the new substrate, electrical contact, heat dissipater, current dissipater heat sink and physical support after the removal of the original substrate 4, a pattern of thick resists 12 is applied to or in the outer third seed layer 9 by standard photolithography (FIG. 6). The thick metal layer 29 is formed in the regions 30 between and as defined by the thick resists 12 (FIG. 7). The thick layer 29 may be formed by electroplating, and may be formed over the thick resists 12 to form a single metal support layer 29. As the p-type layer 1 is relatively thin, the heat generated in active layer 2 is more easily able to be conducted to the thick layer 30.

Alternatively, before the application of the thick resists 12, the third seed layer 9 may be partially etched in the center of the street 31 between the mesas 32 for the formation of the thick photoresists 12 (FIG. 6) and plating of the main copper layer 29 (FIG. 7). This has the advantage of improved adhesion.

The resists 12 may be of a material such as, for example, SU-8 or any other material able to form high aspect ratio patterns. The pattern of the resists 12 defines the ultimate shape and size of the devices.

Figure 8:
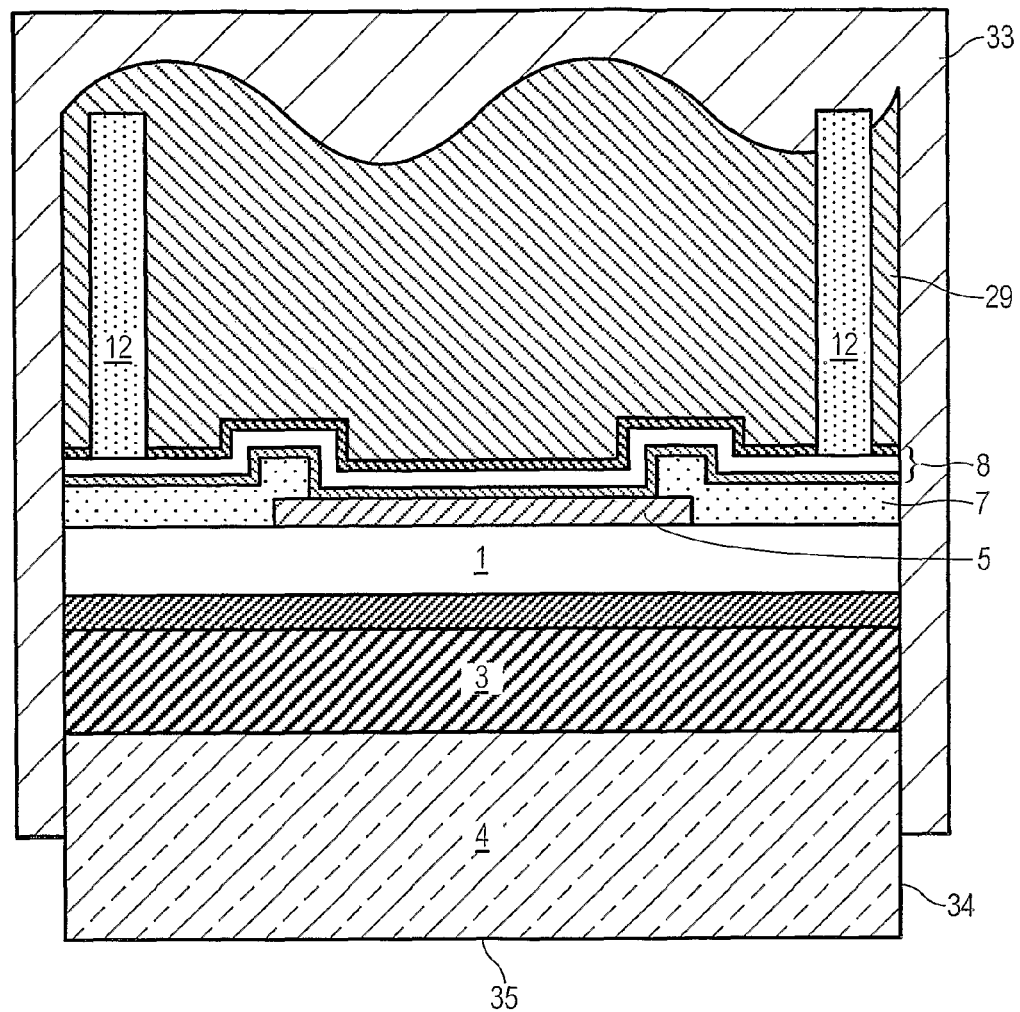
FIG. 8 is a non-scale schematic, cross-sectional view of a semiconductor at an eighth stage in the fabrication process.
Figure 9:
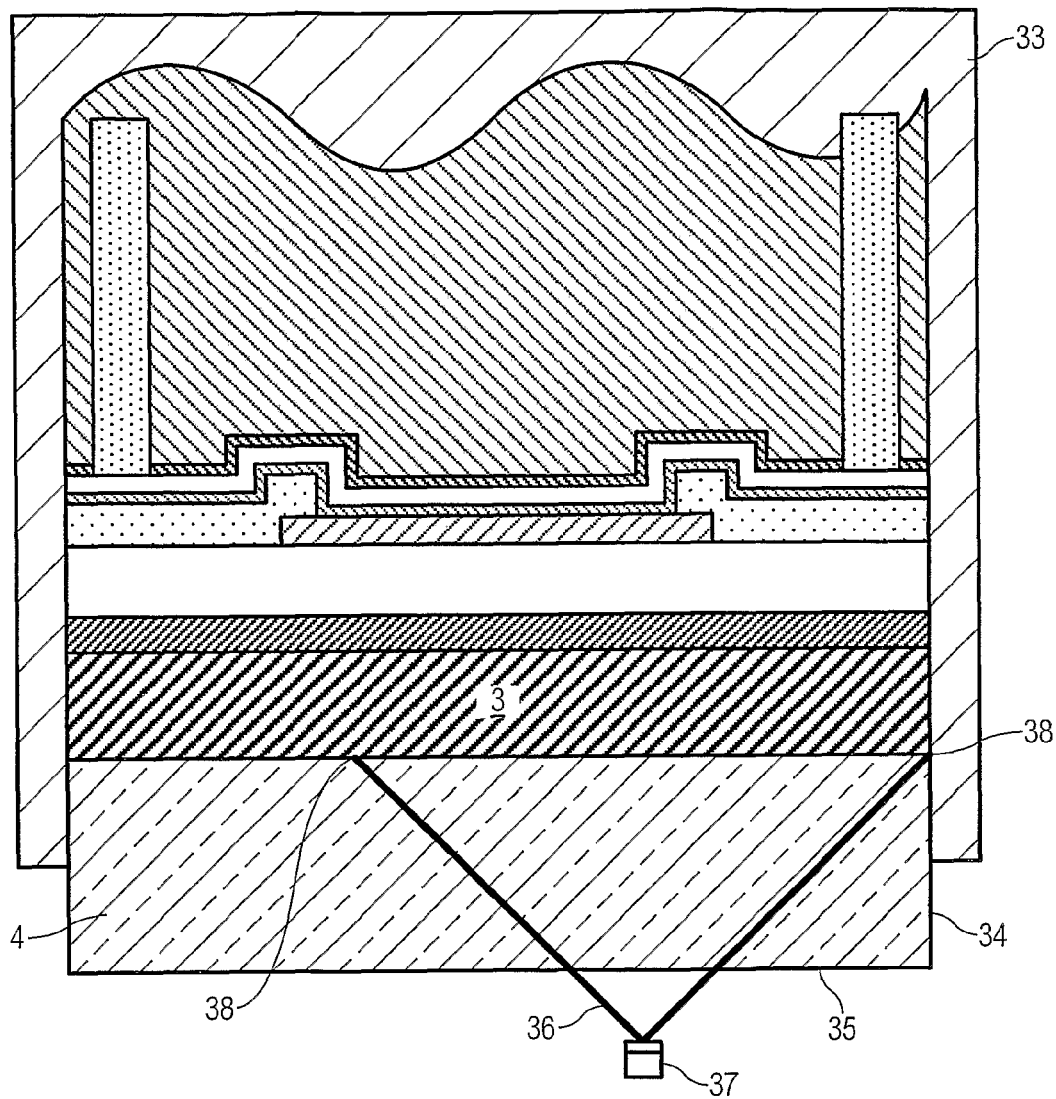
FIG. 9 is a non-scale schematic, cross-sectional view of a semiconductor at a ninth stage in the fabrication process.

The removal or lift-off of the sapphire substrate 4 then takes place (FIGS. 8 and 9). A soft buffer material 33 is provided that encapsulates the entire wafer, or part of the material of the wafer, and the exposed lower surface 35 of the sapphire substrate 4. The buffer material 33 may be, for example, a rubber emulsion, a silicone, an epoxy, an emulsion, a glue, a thermal glue, Crystal Bond™, wax, or the like.

A laser 37 is used to apply a beam 36 and through the sapphire substrate 4 to the interface between the sapphire substrate 4 and n-type GaN layer 3 to separate the sapphire substrate 4 from the n-type GaN layer 3. The beam 36 may be diverging (as shown) or collimated. The edges 38 of the laser beam 36 are preferably well defined, or sharp. More preferably, the laser beam is relatively uniform, although a lack of uniformity will not cause failure. The sharp edges 38 may be formed by shaping the laser beam 36 such as, for example, by use of one or more of: razor edges, an aperture, cropping by a mask, a set of optics such as, for example, one or more beam imaging lenses. The laser beam 36 may overlap in its application over the entire the interface of the sapphire substrate 4 and n-type GaN layer 3. Both solid state lasers and excimer lasers may be used. A beam homogenizer may be used to generate an homogenous beam. For example it may be a KrF excimer laser at 248 nm.

As a result, the sapphire substrate 4 is removed. The soft buffer layer 33 may then be removed.

The thick resists 12 and the soft buffer layer 33 minimize, or eliminate, by absorbsion any "supersonic" shock including wave shock, shock waves and shock fronts, during the laser lift off process caused by the laser interaction with the semiconductor. This assists in reducing the tendency of the epitaxial layers 1, 2, 3 to crack during the laser lift off process.

This exposes the lowermost surface 13 of the n-type GaN layer 3. It is preferred for lift-off of the substrate 4 to take place while the epitaxial layers are intact to improve the quality of removal, and for structural strength. By having the epitaxial layers intact at the time of removal the electrical and mechanical properties of the epitaxial layers are preserved.

Figure 10:
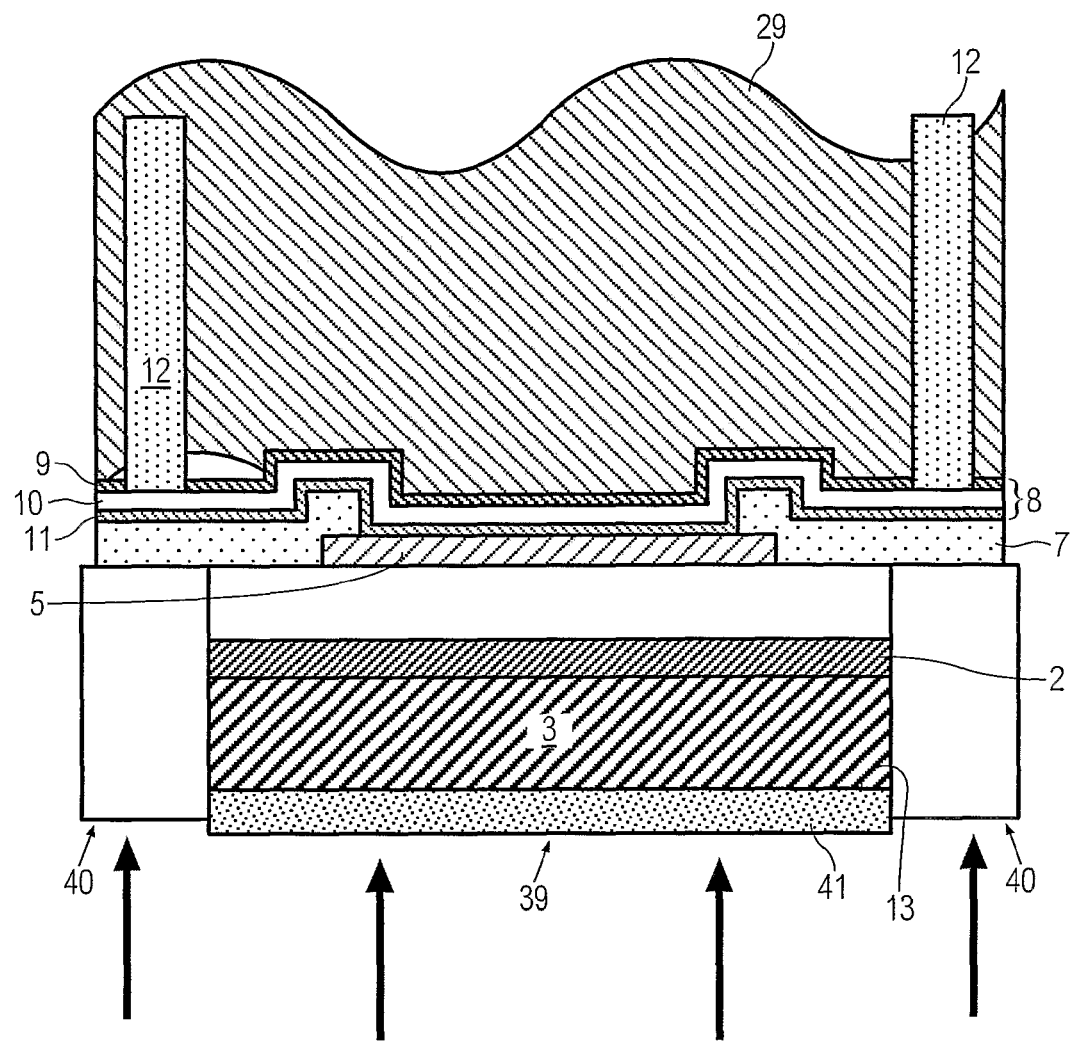
FIG. 10 is a non-scale schematic, cross-sectional view of a semiconductor at a tenth stage in the fabrication process.
Figure 12:
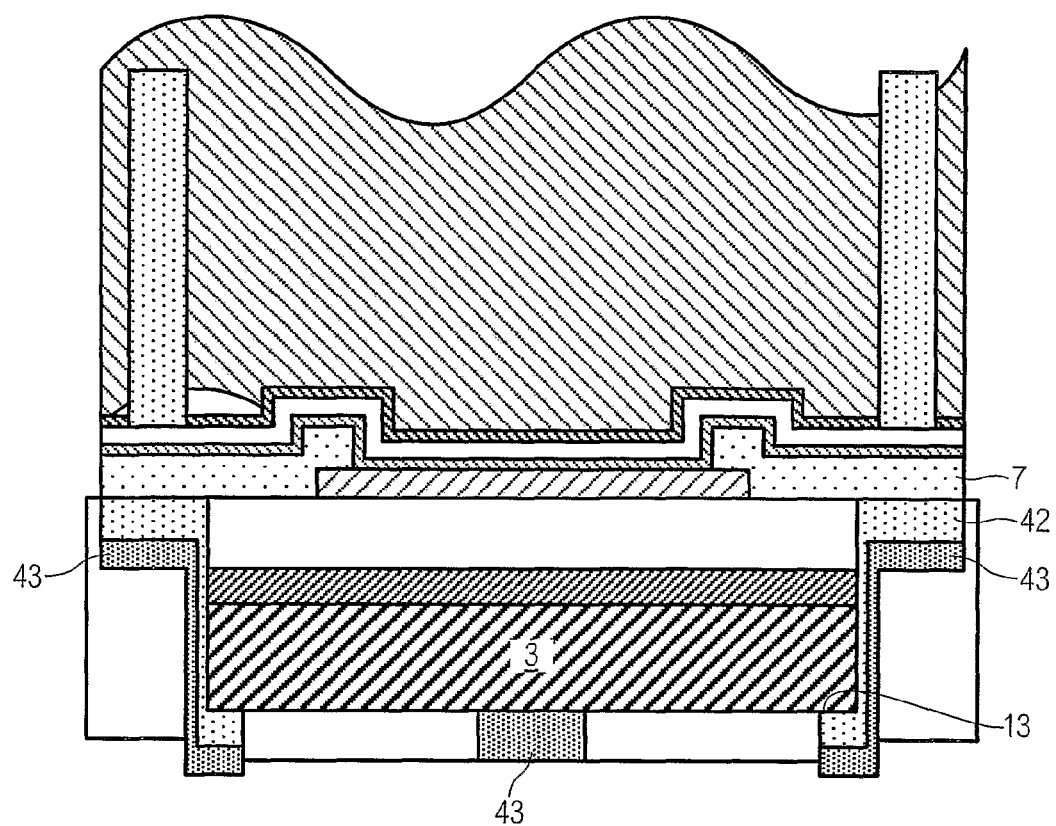
FIG. 12 is a non-scale schematic, cross-sectional view of a semiconductor at a twelfth stage in the fabrication process.
Figure 13:
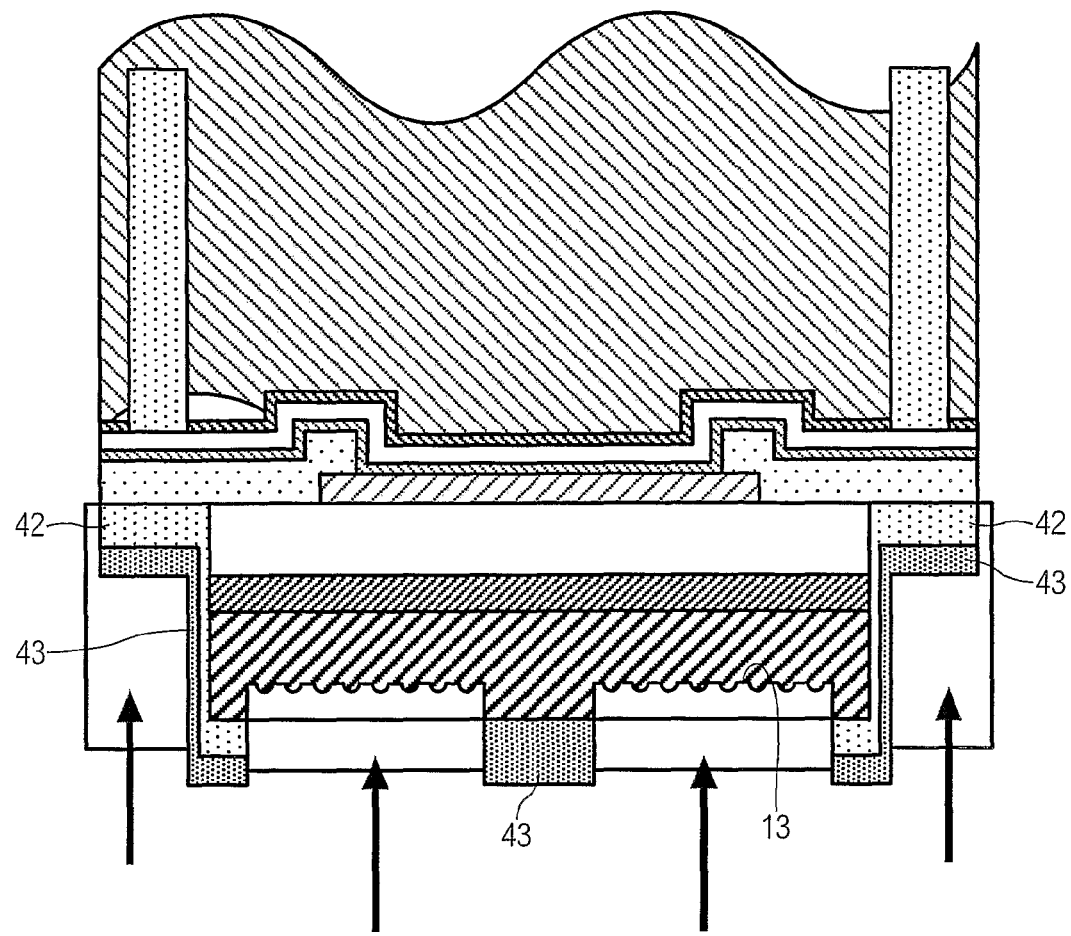
FIG. 13 is a non-scale schematic, cross-sectional view of a semiconductor at a thirteenth stage in the fabrication process.
Figure 14:
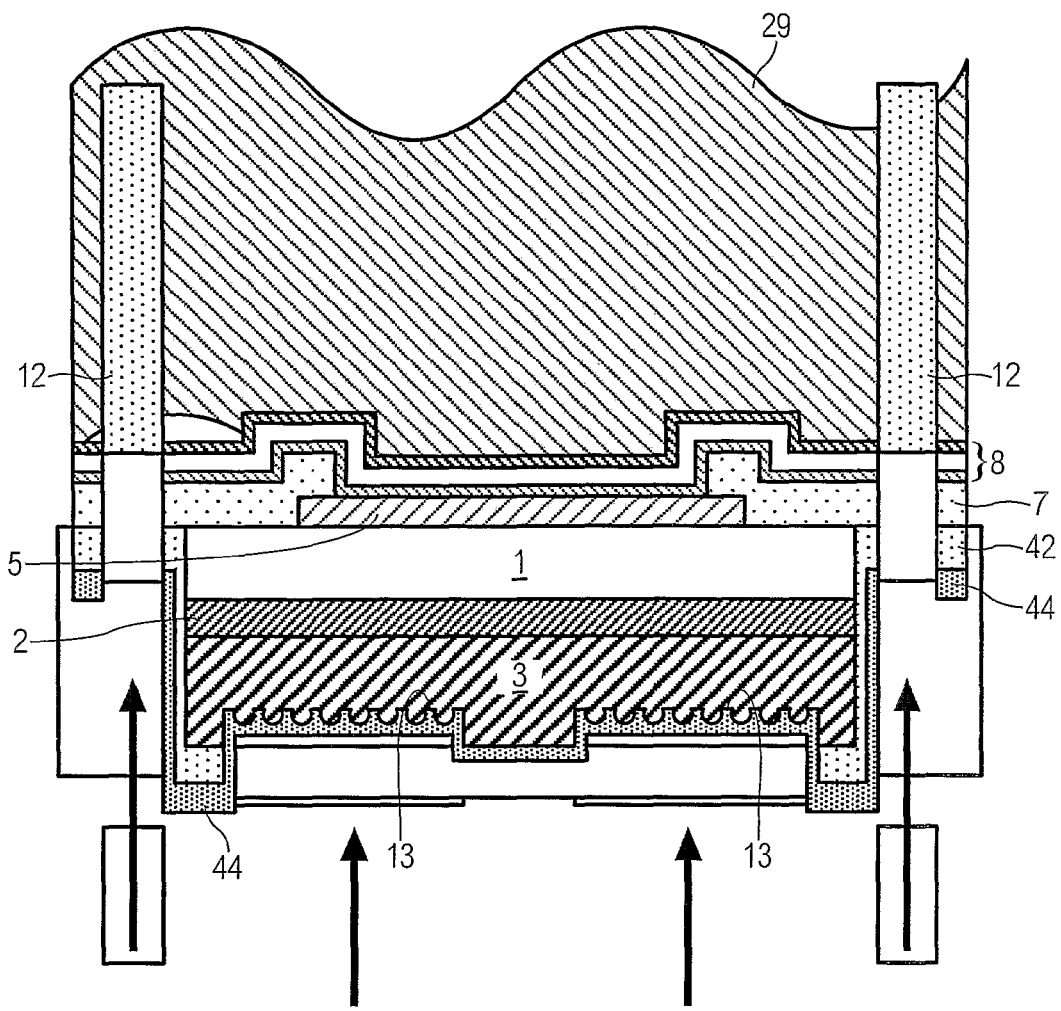
FIG. 14 is a non-scale schematic, cross-sectional view of a semiconductor at a fourteenth stage in the fabrication process.

As shown in FIG. 10, the individual devices are then isolated from each other by trench etching from the newly exposed surface along the edges 40 of the mesa 39, as shown in FIGS. 12 to 14, with a photoresist layer 41 protecting the regions of the n-type GaN-layer 3 during the etching process. This leaves the SiO$_2$ layer 7 exposed around the mesa 39. The resist 41 is then removed.

Alternatively, the lowermost surface 13 of the n-type layer 3 may be cleaved at locations in alignment with the photoresists 12 and the dies separated. This is of advantage for laser diodes as the exposed side surfaces of the n-type layer 3 are substantially parallel, thereby forming mirrors, and thus causing a large amount of total internal reflection. This acts as a light amplification system for improved, and directed, light output.

Figure 11:
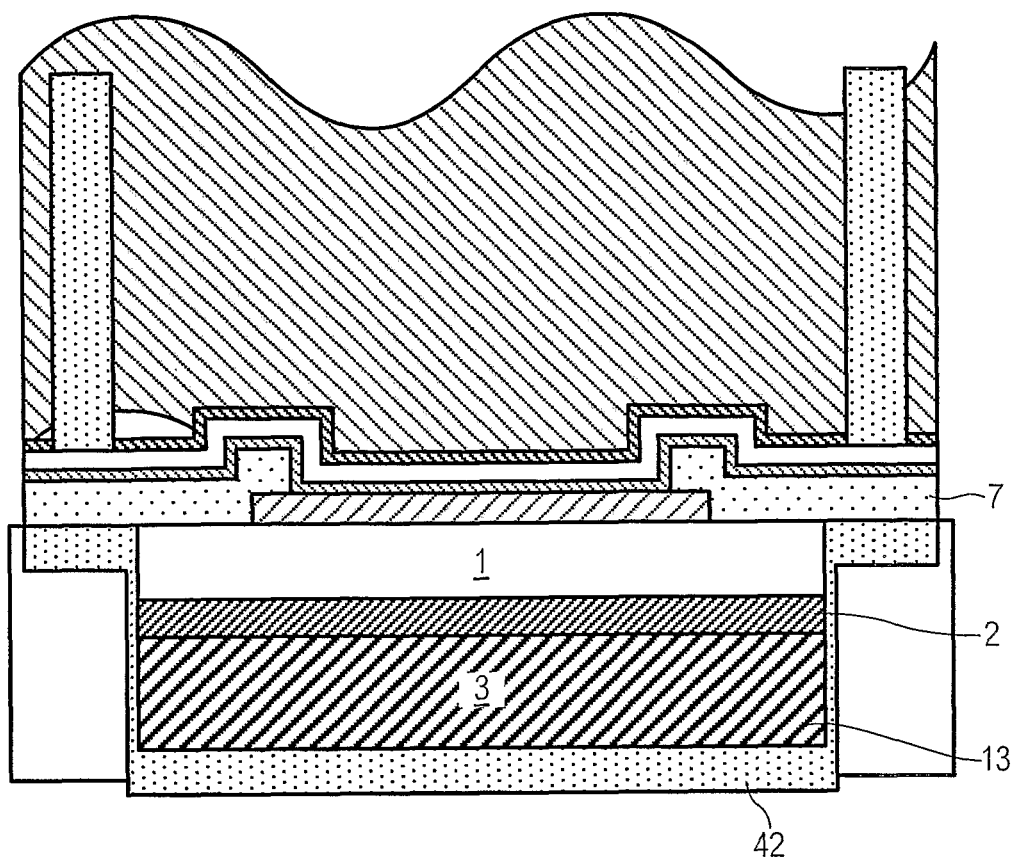
FIG. 11 is a non-scale schematic, cross-sectional view of a semiconductor at an eleventh stage in the fabrication process.

A layer 42 of SiO$_2$ is applied over the exposed surfaces of the SiO$_2$ layer 7, the sides of the n-type GaN layer 3, and the center of the n-type GaN layer 3 (FIG. 11). Pad etching then takes place to remove the SiO$_2$ layer to expose the surface 13 of the n-type layer 3.

A further resist layer 43 is applied over the exposed surfaces of the SiO$_2$ layer 42 and the center of the exposed surface 13 leaving a gap 16 for etching of the exposed surface 13. Etching takes place through the gap 16 to surface texture the exposed surface 13.

The resist 43 is removed and a new resist layer 44 is applied over all exposed lower-surfaces except those aligned with thick patterns 12. Etching then takes place (FIG. 14) through the SiO$_2$ layers 42 and 7, and seed layers 8, until the ends of the thick patterns 12 are exposed.

Figure 15:
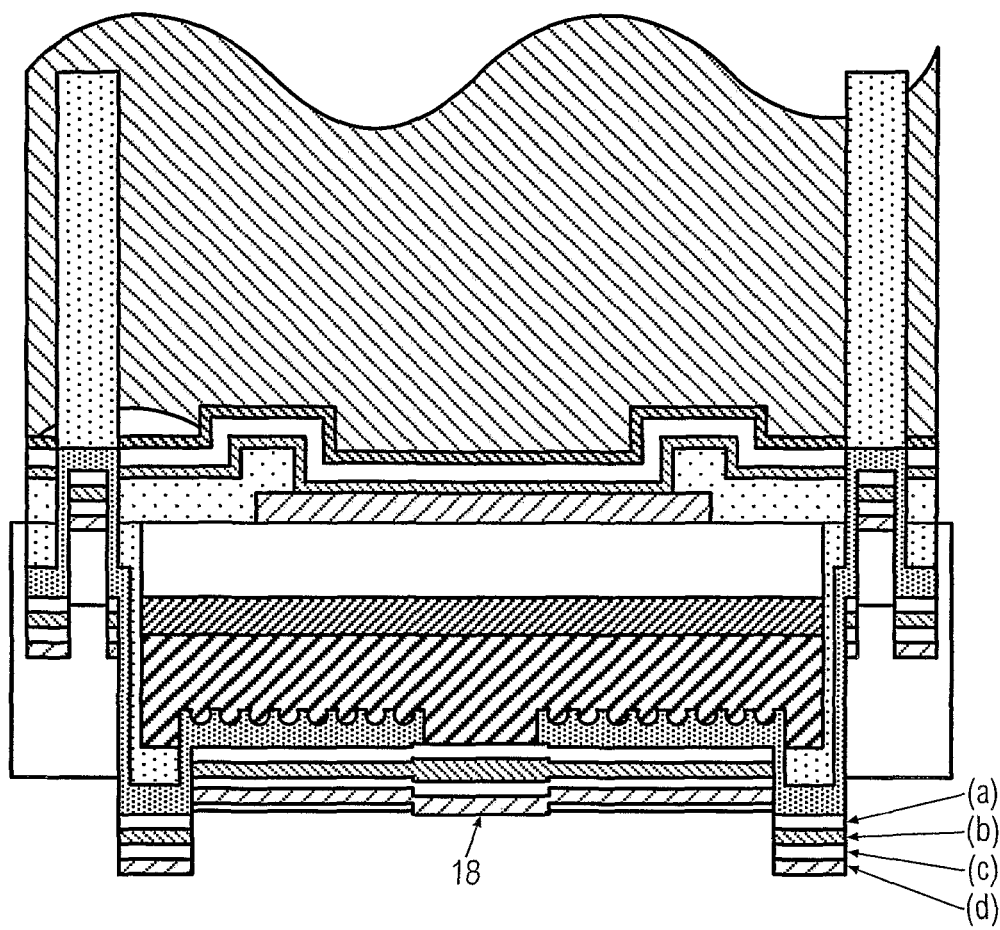
FIG. 15 is a non-scale schematic, cross-sectional view of a semiconductor at a fifteenth stage in the fabrication process.

A layer or layers 18 of metals are then applied over the resist 44 with the layer 18 having a gap 17 at the center of the n-type GaN layer 3 so that the layers 18 are applied directly to the GaN layer 3 (FIG. 15). The resist layer 44, with the layer 18 attached, is removed leaving the layer 18 attached to the center 17 of the n-type GaN layer 3 where gap 17 was previously located. The layers 18 may be one or more layers. All layers 18 may be the same or different. They may be, for example, 18(*a*) titanium, 18(*b*) aluminum, 18(*c*) titanium and 18(*d*) gold, respectively.

Figure 16:
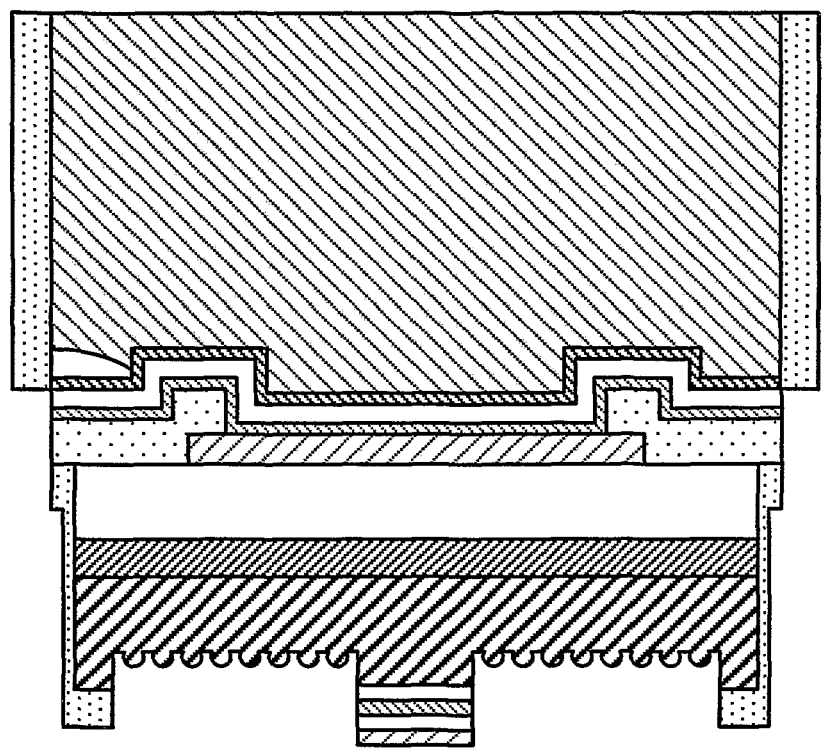
FIG. 16 is a non-scale schematic, cross-sectional view of a semiconductor at a sixteenth stage in the fabrication process.

The copper layer 29 is then polished flat (FIG. 16). The dies are then each separated by physical separation as the patterns 12 do not adhere to the copper of the thick layer 29.

In this way the seed layers 11, 10, 9 and the copper layer 29 act as reflectors to increase light output, with copper layer 29 being one terminal, thus not interfering with light output. The second terminal is layer 18 on the n-type layer 3 of GaN.

Whilst there has been described in the foregoing description preferred embodiments of the present invention, it will be understood by those skilled in the technology concerned that many variations or modifications in details of design or construction may be made without departing from the present invention.

The invention claimed is:

1. A method of fabricating semiconductor devices, the method comprising:
   providing a wafer comprising a substrate with a plurality of epitaxial layers mounted on the substrate;
   forming patterns above the plurality of epitaxial layers remote from the substrate;
   forming a second substrate of a conductive metal on the plurality of epitaxial layers remote from the substrate and between the patterns;
   at least partially encapsulating the second substrate, the plurality of epitaxial layers and the substrate with a soft buffer material; and
   separating the substrate from the plurality of epitaxial layers at the wafer level and while the plurality of epitaxial layers are intact while preserving electrical and mechanical properties of the plurality of epitaxial layers by applying a laser beam through the substrate to an interface of the substrate and the plurality of epitaxial layers, the laser beam having well defined edges.

2. A method as claimed in claim 1, wherein the well defined edges are sharp edges.

3. A method as claimed in claim 2, wherein the sharp edges are formed by the use of at least one selected from the group consisting of: razor edges, cropping by a mask, an aperture, a set of optics, and one or more imaging lenses.

4. A method as claimed in claim 1, wherein the soft buffer layer is selected from the group consisting of: an emulsion, a rubber emulsion, silicone, epoxy, glue, a thermal glue, Crystal Bond, and wax.

5. A method as claimed in claim 1, wherein the soft buffer material fully encapsulates the second substrate, the plurality of epitaxial layers, and the substrate.

6. A method as claimed in claim 1 further comprising: prior to forming the patterns, forming a thin layer of at least one p-type metal Ohmic contact layer on the plurality of epitaxial layers, and forming at least one seed layer on the at least one p-type metal Ohmic contact layer.

7. A method as claimed in claim 1, wherein the second substrate is relatively thick and is for at least one selected from the group consisting of: a structural support, a heat sink, a heat dissipater, a current dissipater, and as a terminal, for the semiconductor devices.

8. A method as claimed in claim 1, wherein the patterns are a photoresist formed by photolithography.

9. A method as claimed in claim 8, wherein the photoresist is of a height of at least 10 micrometers.

10. A method as claimed in claim 9, wherein the height is at least 100 micrometers.

11. A method as claimed in claim 8, wherein the photoresist is of a material that can form high aspect ratio patterns.

12. A method as claimed in claim 11, wherein the photoresist is SU-8.

13. A method as claimed in claim 8, wherein the photoresist is of a material that at least minimizes by absorbsion any shock during the laser lift off process caused by the laser interaction with the semiconductor the shock including at least one selected from the group consisting of: wave shock, shock waves and shock fronts.

14. A method as claimed in claim 8, further comprising: prior to forming the patterns, forming a thin layer of at least one p-type metal Ohmic contact layer on the plurality of epitaxial layers, and forming at least one seed layer on the at least one p-type metal Ohmic contact layer,
wherein before the application of the photoresist, the at least one seed layer is partially etched in the center of each street between mesas, the photoresist patterns being formed in the etched portion in the centre of each street.

15. A method as claimed in claim 1, wherein the beam is selected from the group consisting of: diverging, and collimated.

16. A method of fabricating semiconductor devices, the method comprising:
providing a wafer comprising a substrate with a plurality of epitaxial layers mounted on the substrate;
forming patterns above the plurality of epitaxial layers remote from the substrate;
forming a second substrate of a conductive metal on the plurality of epitaxial layers remote from the substrate and between the patterns;
fully encapsulating the second substrate, the plurality of epitaxial layers and the substrate with a soft buffer material; and
separating the substrate from the plurality of epitaxial layers at the wafer level and while the plurality of epitaxial layers are intact while preserving electrical and mechanical properties of the plurality of epitaxial layers by applying a laser beam through the substrate to an interface of the substrate and the plurality of epitaxial layers, the laser beam having well defined edges.

17. A method of fabricating semiconductor devices, the method comprising:
providing a wafer comprising a substrate with a plurality of epitaxial layers mounted on the substrate;
forming a thin layer of at least one p-type metal Ohmic contact layer on the plurality of epitaxial layers;
forming at least one seed layer on the at least one p-type metal Ohmic contact layer;
forming patterns above the plurality of epitaxial layers remote from the substrate;
forming a second substrate of a conductive metal on the plurality of epitaxial layers remote from the substrate and between the patterns;
at least partially encapsulating the second substrate, the plurality of epitaxial layers and the substrate with a soft buffer material; and
separating the substrate from the plurality of epitaxial layers at the wafer level and while the plurality of epitaxial layers are intact while preserving electrical and mechanical properties of the plurality of epitaxial layers by applying a laser beam through the substrate to an interface of the substrate and the plurality of epitaxial layers, the laser beam having well defined edges.

* * * * *